US006290481B1

(12) United States Patent
Huang

(10) Patent No.: US 6,290,481 B1
(45) Date of Patent: Sep. 18, 2001

(54) FLASH-FREE MOLD STRUCTURE FOR INTEGRATED CIRCUIT PACKAGE

(75) Inventor: Chien-Ping Huang, Hsinchu Hsien (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/574,878

(22) Filed: May 19, 2000

(51) Int. Cl.[7] ............................ B29C 45/14; H01L 21/56

(52) U.S. Cl. ................ 425/116; 264/272.17; 264/328.9; 425/544; 425/588

(58) Field of Search .................................... 425/116, 125, 425/544, 572, 588; 264/272.15, 272.17, 328.9

(56) References Cited

U.S. PATENT DOCUMENTS

| | | | |
|---|---|---|---|
| 4,126,292 * | 11/1978 | Saeki et al. | 425/572 |
| 4,779,835 * | 10/1988 | Fukushima et al. | 425/116 |
| 5,556,647 * | 9/1996 | Abe et al. | 425/544 |
| 5,928,595 * | 7/1999 | Knapp et al. | 425/544 |
| 5,971,734 | 10/1999 | Moon | 425/127 |

FOREIGN PATENT DOCUMENTS

| | | | |
|---|---|---|---|
| 63-10533-A * | 1/1988 | (JP) | 264/272.17 |
| 1-315148-A * | 12/1989 | (JP) | 425/588 |

* cited by examiner

*Primary Examiner*—Robert Davis
(74) *Attorney, Agent, or Firm*—Peter F. Corless; Edwards & Angell, LLP

(57) ABSTRACT

A flash-free mold structure is designed for use in the molding of an encapsulant for encapsulating a semiconductor die. The flash-free mold structure includes a first molding piece and a second molding piece. The second molding piece is formed with a resin passage for an encapsulating material to flow therethrough during molding process. It is a characteristic feature of this flash-free mold structure that a cutaway portion, which can be either an one-step cutaway portion or a multi-step cutaway portion, is formed at the rim of the resin passage. The cutaway portion is dimensioned significantly smaller than the resin passage for the retarding the flow speed of the encapsulating material from the resin passage into the cutaway portion during the molding process, thereby preventing the encapsulating material from entering the fissure in the junction between the first and second molding pieces. The resin passage can be either a cull, a runner, or a subrunner defined by the first and second molding pieces. With this flash-free mold structure, the IC packaging quality can be assured and fabrication tools can be prevented from contamination.

4 Claims, 2 Drawing Sheets

FLASH-FREE MOLD STRUCTURE FOR INTEGRATED CIRCUIT PACKAGE

BACKGROUND OF THE INVENTION

1. Field of the Invention:

This invention relates to mold structures, and more particularly, to a mold structure for use in the molding of an encapsulant for encapsulating a semiconductor chip.

2. Description of Related Art:

Molding process is an important step in IC packaging, in which a set of specially-shaped molding pieces are used for the molding of an encapsulant for encapsulating semiconductor dies. In use, the molding pieces are attached to each other to define a cavity therewithin; and then, an encapsulating material, typically resin, can be filled into the cavity to form the intended encapsulant.

Conventionally, there are many various kinds of patented mold structures that can be used in the molding of encapsulants, such as the U.S. Pat. No. 5,971,734.

One drawback to the conventional mold structures, however, is that flash would easily occur at the junction between the two molding pieces. This is because that the junction between the two molding pieces would hardly reach the level of absolute airtightness, and consequently, a fissure would be left at the junction. During the molding process, flash occurs if the melted resin enters this fissure. This drawback is further illustratively depicted in the following with reference to FIGs. 1A–1B.

FIG. 1A shows a schematic top view of the mold structure disclosed in the U.S. Pat. No. 5,971,734. As shown, this patented mold structure includes a bottom molding piece 10 and an upper molding piece 20; and when these two molding pieces 10, 20 are attached to each other, it defines a cull 11, a runner 12, a subrunner 13, and a molding cavity 14 therewithin (for detailed description of these parts, please refer to the specification of U.S. Pat. No. 5,971,734). During molding process, melted resin is introduced into the cull 11 and which will then flow through the runner 12 and the subrunner 13 to be guided into the respective molding cavity 14 for the purpose of forming an encapsulant (not shown) in each molding cavity 14.

However, as shown in FIG. 1B, the junction between the bottom molding piece 10 and the upper molding piece 20 would hardly reach the level of absolute airtightness; and consequently, a fissure 30 would be left in the junction. Although this fissure 30 is very small in dimension, it would nevertheless allow a small part of the melted resin used in the molding process to enter therein, thus causing undesired flash into the fissure 30. As roughly illustrated in FIG. 1A, after the molding process is completed, flashed resin would be left around the rims of the cull 11, the runner 12, and the subrunner 13 (the flashed resin is indicated by the reference numeral 15).

To remove the flashed resin, it is required to perform a cleaning process prior to the next round of molding process. However, this cleaning process would undesirably cause the removed resin to be scattered away, thus causing contamination to the nearby fabrication tools, making the removed resin easily attached to the molded encapsulants during the next round of molding process. This would degrade the IC packaging quality.

SUMMARY OF THE INVENTION

It is therefore an objective of this invention to provide a flash-free mold structure, which can help prevent flash during molding process.

It is another objective of this invention to provide a flash-free mold structure, which can help ensure the IC packaging quality.

It is still another objective of this invention to provide a flash-free mold structure, which can prevent the fabrication tools from being contaminated during molding process.

In accordance with the foregoing and other objectives, the invention proposes a flash-free mold structure. The flash-free mold structure of the invention includes: (a) a first molding piece having a junction side; and (b) a second molding piece having a junction side for coupling with the junction side of the first molding piece during molding process; the second molding piece being formed with a resin passage for an encapsulating material to flow therethrough during molding process. It is a characteristic feature of the invention that a cutaway portion is formed at the rim of the resin passage, which is dimensioned significantly smaller than the resin passage so as to allow the encapsulating material flowing into the cutaway proportion to accelerate the speed of absorbing the heat of the molding pieces and then make the capsulating material increased in viscosity; as a result, the flow speed of the encapsulating material is retarded, thereby preventing the encapsulating material from entering the fissure between the first molding piece and the second molding piece during the molding process.

The foregoing flash-free mold structure of the invention can help prevent flash from occurring at the rims of the cull, the runner, and the subrunner defined by a first molding piece and a second molding piece, so that IC packaging quality can be assured and fabrication tools can be prevented from contamination. The invention is therefore more advantageous to use than the prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

In accordance with the invention, two preferred embodiments are disclosed in the following with reference to FIG. 2 and FIG. 3 respectively.

Figure 2:
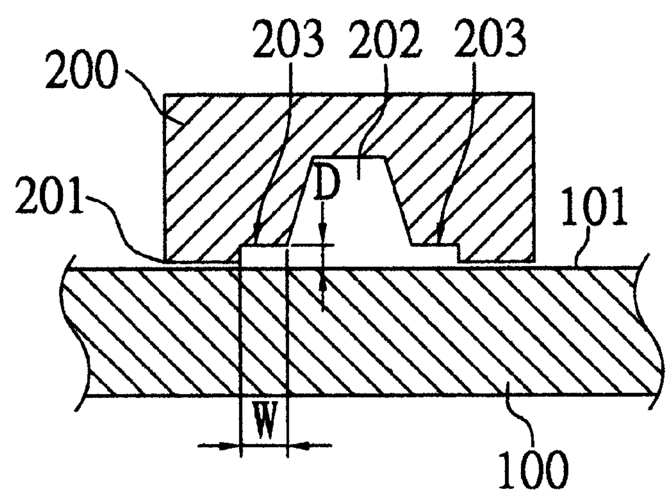
FIG. 2 is a schematic sectional diagram showing a first preferred embodiment of the flash-free mold structure according to the invention.

First Preferred Embodiment (FIG. 2)

FIG. 2 is a schematic sectional diagram showing the first preferred embodiment of the flash-free mold structure according to the invention.

As shown, the flash-free mold structure of the invention includes a bottom molding piece 100 and an upper molding piece 200. During molding process, the bottom molding piece 100 and the upper molding piece 200 are attached to each other in such a manner that the bottom side (junction side) 201 of the upper molding piece 200 is attached to the upper side (unction side) 101 of the bottom molding piece 100.

Figure 1A:
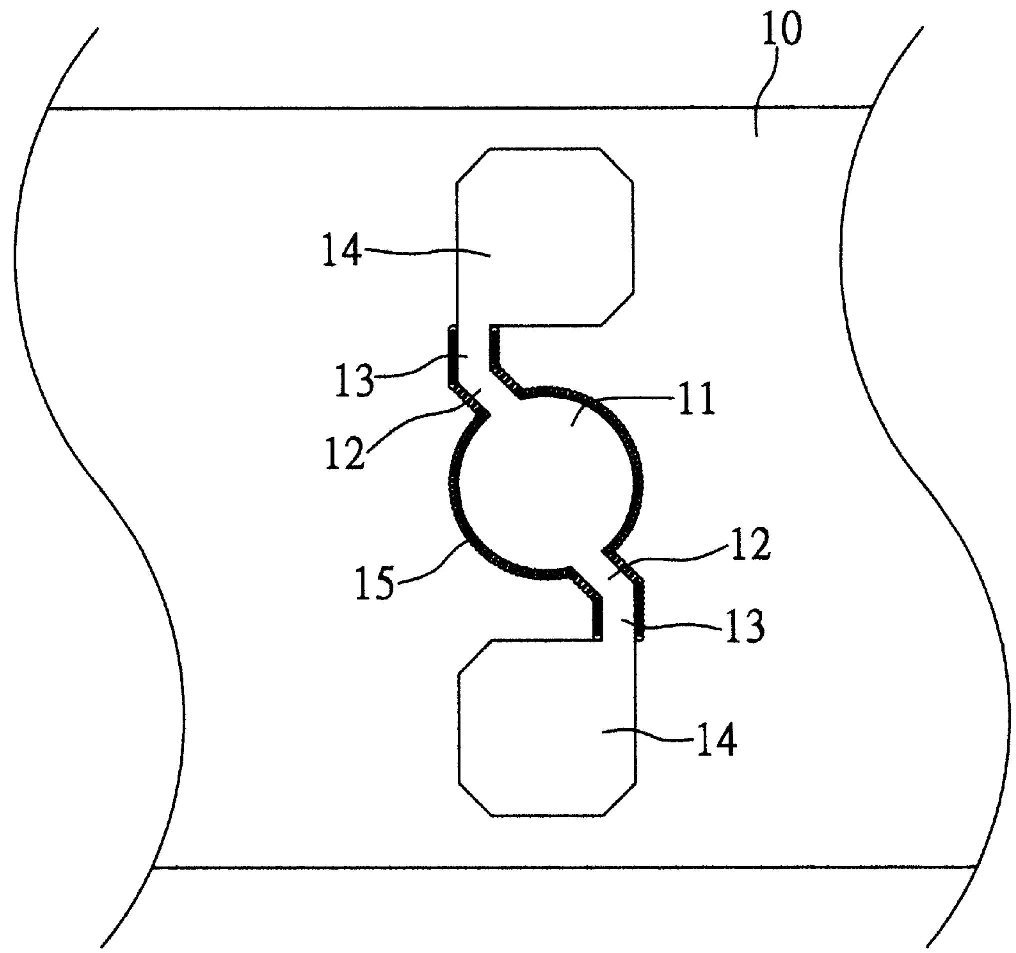
FIG. 1A (PRIOR ART) is a schematic top view of a mold structure disclosed in U.S. Pat. No. 5,971,734 on which flash would occur.
Figure 1B:
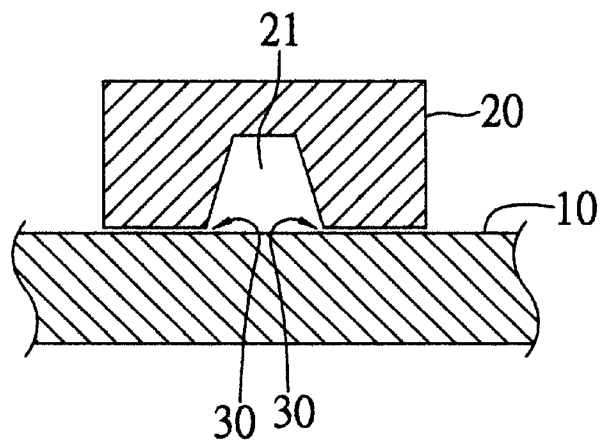
FIG. 1B (PRIOR ART) is a schematic sectional diagram used to depict the reason why flash would occur in the junction between the upper and bottom molding pieces.

Further, the upper molding piece 200 is formed with a resin passage 202 (which can be either the injection cull 11, the runner 12, or the subrunner 13 shown in FIGs. 1A–1B). During molding process, melted resin will flow through the resin passage 202. Of course, the resin passage can be formed either in the lower molding piece 100 or in the lower and upper molding pieces respectively.

It is a characteristic feature of the invention that an one-step cutaway portion 203 is formed at the rim of the resin passage 202, which should be dimensioned significantly smaller than the resin passage 202. Preferably, the one-step cutaway portion 203 has a width W of from 0.5 mm to 1.5 mm and a depth D of from 0.05 mm to 0.15 mm (millimeter). Compared to the resin passage 202, the one-step cutaway portion 203 serves as a constricted passage that can help the melted resin from the resin passage 202 accelerate the speed of absorbing the heat of the molding pieces 100 and 200, making the melted resin increased in viscosity. As a result, the melted resin in the one-step cutaway portion 203 would significantly reduced in speed, making it less likely to enter into the fissure in the junction between the bottom and upper molding pieces 100, 200 that would otherwise cause flash as in the case of the prior art.

In FIG. 2, it is to be noted that the resin passage 202 is defined in a broad sense to represent either the cull 11, the runner 12, or the subrunner 13 shown in FIGs. 1A–1B) where flash would occur. Broadly speaking, the step cutaway portion 203 can be formed at any places in the mold structure where flash would occur due to the existence of a fissure at the junction between the two molding pieces.

Figure 3:
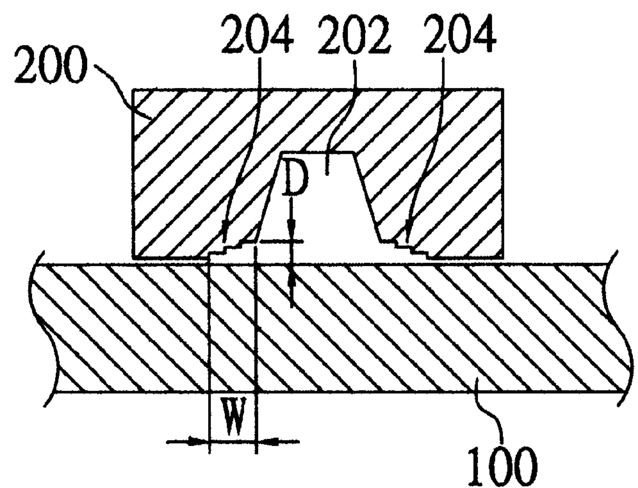
FIG. 3 is a schematic sectional diagram showing a second preferred embodiment of the flash-free mold structure according to the invention.

Second Preferred Embodiment (FIG. 3)

FIG. 3 is a schematic sectional diagram showing the second preferred embodiment of the flash-free mold structure according to the invention. In FIG. 3, all the parts that are identical to those in the previous embodiment shown in FIG. 2 are labeled with the same reference numerals.

This embodiment differs from the previous one only in that a multi-step cutaway portion 204, rather than a step cutaway portion, is formed at the rim of the resin passage 202. Preferably, the multi-step cutaway portion 204 has a width W of from 0.5 mm to 1.5 mm and a depth of from 0.05 mm to 0.15 mm.

Due to this multi-step structure, it can help the melted resin accelerate the speed of absorbing the heat of the molding pieces 100 and 200 more quickly than the step cutaway portion 203 used in the previous embodiment, making the melted resin become viscous more quickly and thus less likely to enter into the fissure in the junction between the bottom and upper molding pieces 100, 200 that would otherwise cause flash as in the case of the prior art.

Conclusion

In conclusion, the invention provides a flash-free mold structure which can help prevent flash from occurring at the rim of resin passage such as the cull, the runner, and the subrunner defined by the bottom molding piece and the upper molding piece, so that IC packaging quality can be assured and fabrication tools can be prevented from contamination. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A flash-free mold structure, which comprises:

a first molding piece having a junction side; and a second molding piece having a junction side for coupling with the junction side of the first molding piece during molding process; the second molding piece being formed with a passage for an encapsulating material to flow therethrough during molding process;

wherein a cutaway portion is formed at the rim of the passage, which is dimensioned significantly smaller than the passage.

2. The flash-free mold structure of claim 1, wherein the cutaway portion is an one-step cutaway portion.

3. The flash-free mold structure of claim 1, wherein the cutaway portion is a multi-step cutaway portion.

4. The flash-free mold structure of claim 1, wherein the cutaway portion has a width of from 0.5 mm to 1.5 mm and a depth of from 0.05 mm to 0.15 mm.

* * * * *